June 20, 1961 R. F. RUTZ 2,989,426

METHOD OF TRANSISTOR MANUFACTURE

Filed June 6, 1957 3 Sheets-Sheet 1

INVENTOR.
RICHARD F. RUTZ

BY Alvin J. Riddles

AGENT

United States Patent Office 2,989,426

Patented June 20, 1961

2,989,426

METHOD OF TRANSISTOR MANUFACTURE

Richard F. Rutz, Fishkill, N.Y., assignor to International Business Machines Corporation, New York, N.Y., a corporation of New York Filed June 6, 1957, Ser. No. 664,130
8 Claims. (Cl. 148—1.5)

This invention relates to semiconductor signal translating devices and in particular to semiconductor signal translating devices capable of discriminating with respect to the signal being translated.

In semiconductor circuitry, it is frequently of advantage to provide a condition whereby a high impedance is presented to one type of signal appearing at an input while at the same time providing a low impedance to another type of signal. This type of situation appears frequently in connection with pulse type circuitry wherein spurious potential excursions of an input line may cause switching. Most approaches to this problem, with respect to pulse circuitry, that have thus far appeared in the art, involve reactive elements coupled to the input which have a detrimental effect on frequency response so that in many cases, in such circuitry, in order to provide a circuit with noise or spurious input potential excursion control, it is necessary to compromise with the performance of the circuit.

A primary object is to provide a method of making semiconductor devices.

Another object is to provide a method of making a connection to a semiconductor crystal capable of rejecting a signal of a selectable magnitude.

Another object is to provide a method of making a junction semiconductor device.

Another related object is to provide method of making a base connection to a transistor.

Another related object is to provide a method of making a junction transistor having an amplification factor less than unity.

Another related object is to provide a method of making a junction transistor having an amplification factor greater than unity.

Another related object is to provide a method of making a multiple electrode transistor.

Another related object is to provide a voltage translating transistor circuit.

Other objects of the invention will be pointed out in the following description and claims and illustrated in the accompanying drawings, which disclose, by way of example, the principle of the invention and the best mode, which has been contemplated, of applying that principle.

Figure 1:
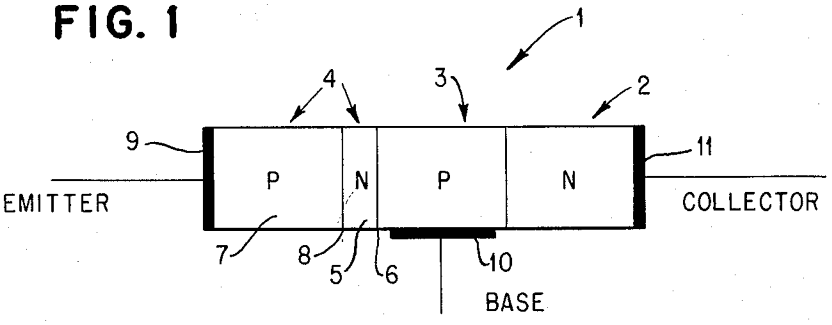
FIG. 1 is a schematic diagram of a junction transistor having an input signal amplitude discriminating emitter.

Referring now to FIG. 1, a schematic diagram of a transistor is shown illustrating the variable threshold emitter. The transistor 1 is made up of monocrystalline semiconductor material and comprises four regions of alternately opposite conductivity type. Region 2 has been designated the collector region and it forms a PN junction with a base region 3 of opposite conductivity semiconductor material. An emitter connection labeled element 4 is provided on the base region 3 sufficiently close to the collector 2 for transistor action. The emitter 4 is made up of a zone 5 of opposite conductivity to the base 3 forming a PN junction 6 therewith and a region 7 of a conductivity opposite to the zone 5 and forming a PN junction 8 therewith. Ohmic connections 9, 10 and 11 are made to region 7 of the emitter, the base region 3 and the collector region 2, respectively.

In this structure, the emitter region 4 serves as a variable threshold minority carrier injecting electrode capable of injecting minority carriers into the base region 3 only after a given threshold voltage has been exceeded. The PN junction 6 serves the function of a conventional emitter junction in injecting minority carriers when forward biased whereas the PN junction 8 has a conductivity type arrangement, such, that for input signal polarities compatible with the base region 3 and collector region 4, it presents a high impedance to input signal current flow. The high impedance to input signal current flow prevails until the reverse breakdown voltage of the junction is overcome at which point the emitter 4 performs the functions of a conventional emitter with a translating potential built into it.

Figure 2:
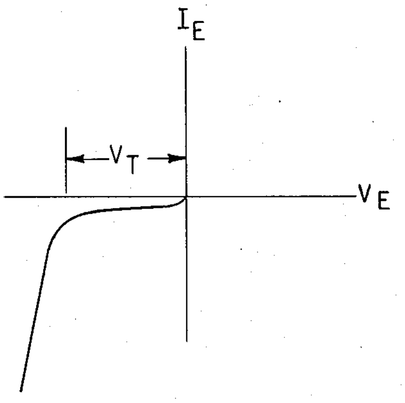
FIG. 2 is an emitter current characteristic curve of the transistor of FIG. 1.

Referring now to FIG. 2, in connection with FIG. 1, the emitter current characteristic curve for the emitter of a transistor, such as FIG. 1, is shown. In this curve, the emitter current is shown increasing very slowly by an amount representing the back current through junction 8 as the input signal applied to the emitter increases until the reverse breakdown voltage of the junction 8 is reached. The reverse breakdown voltage is sometimes known in the art as the "Zener" or "Avalanche" voltage and is labeled $V_T$ in FIG. 2. At $V_T$, the threshold voltage of the emitter, the emitter current curve reaches a knee and rises sharply with very little applied emitter voltage. The curve in the region beyond the knee reflects the very low emitter input impedance of a junction transistor.

Figure 3:
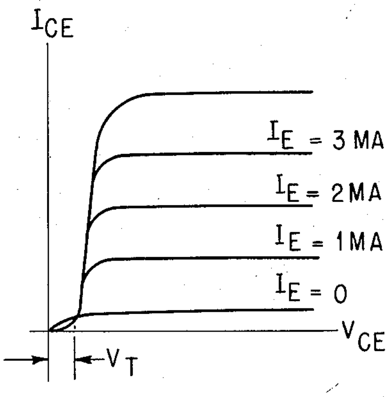
FIG. 3 is the family of collector characteristic curves of the transistor of FIG. 1.

Referring now to FIG. 3, the family of collector current characteristic curves for the common emitter connection is shown for a transistor having an emitter as shown in FIG. 1. In each of the curves $I_E=0$ through $I_E=3$MA no appreciable collector current flows until a sufficient amount of collector voltage is applied to overcome $V_T$. The main difference in a transistor of this type from an ordinary transistor is that the saturation resistance is higher and the active or linear region of the output characteristic is limited to collector voltages greater than $V_T$. This is of particular advantage in the grounded or common emitter type of transistor operation wherein the saturation resistance is a part of power dissipation in the circuit.

The variable threshold emitter may be constructed so as to exhibit any desired threshold voltage by control of the resistivity of the semiconductor material immediately adjacent to the junction 8 in FIG. 1. The mechanism by which the reverse breakdown of the junction 8 occurs is believed to be the "avalanche" mechanism well known in the art and it has been found that junctions having reverse breakdown voltages ranging from a few tenths of a volt to several hundred volts may readily be fabricated by control of the ratio of the resistivities on both sides of the junction.

Semiconductor structures such as that of the above described device may be fabricated in the following manner. The body of the device may be provided by a diffusion operation, such as, the technique of gaseous or vapor diffusion wherein a quantity of a particular conductivity type monocrystalline semiconductor material is exposed to an environment containing opposite conductivity type directing impurities so that the exposed surface of the quantity of semiconductor material to a predetermined depth may be converted to the conductivity type of the impurities present in the environment.

Figure 4:
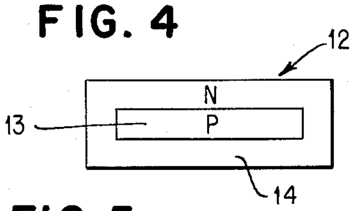
FIGS. 4, 5, 7, 8, 9 and 10 illustrate intermediate semiconductor crystal products as a result of steps performed in one method of manufacturing the transistor of FIG. 1.

Referring now to FIG. 4, a quantity of monocrystalline semiconductor material 12 is shown after the above described diffusion operation. The material 12 has a region 13 of original conductivity type shown in this illustration as P conductivity type and a region from the entire surface of a predetermined depth of opposite conductivity type shown as N. The quantity of material 12 may be used in a manner to be later explained to fabricate a wide variety of semiconductor devices each with desirable characteristics not heretofore readily available in the art.

Figure 5:
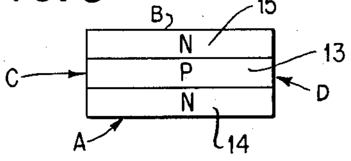

The quantity of material 12 may now be cut so that the ends are removed and a "sandwich" of material having regions of alternately opposite conductivity is achieved. Such a "sandwich" is shown in FIG. 5 as made up of regions of N, P and N conductivity types labeled regions 14, 13 and 15, respectively. In the interest of clarity a certain amount of liberty has been taken with the scale of the figures under description. In order to establish proper perspective, a typical example of an N-P-N sandwich, as shown in FIG. 5, is approximately 0.015 inch from edge C to edge D. A convenient way of providing the material 12 for conversion to the sandwich is to cut a wafer from a grown monocrystalline ingot so that it may be seen that the sandwich of FIG. 5 may be greater than a square inch in area on surfaces A and B. The size of surfaces C and D and hence, the thickness of the wafer is governed mainly by the time required for diffusion. The diffusion process is relatively slow and hence, the wafer is usually quite thin.

Figure 6:
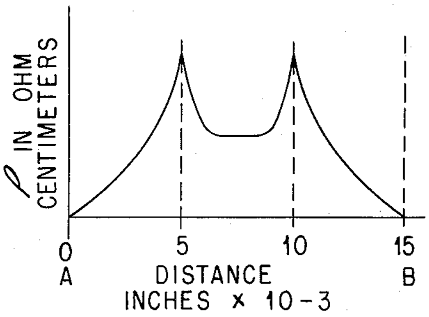
FIG. 6 is a graph showing the resistivity variation with respect to distance from the surface of the semiconductor crystal intermediate product shown in FIG. 5.

Referring now to FIG. 6, a graph of the variation of resistivity symbolized $\rho$, with distance from the surface is shown for the N-P-N sandwich of FIG. 5. Assuming the original resistivity and conductivity type of the wafer 12 in FIG. 4 to be approximately 1 ohm centimeter P type material, the P region 13 of FIG. 5 would remain unchanged in the diffusion operation and would have the resistivity and conductivity type as shown in the P portion of the graph of FIG. 6. As the diffusion operation proceeds greater quantities of N conductivity type directing impurities enter the original P type wafer at surfaces A and B.

Since the conductivity type of a semiconductor material is determined by the predominance of one type over the opposite type of conductivity directing impurity and the resistivity is determined by the net quantity of the predominating impurity type over the opposite type; the diffusion of one type of impurity into a semiconductor crystal in which the opposite type of impurity predominates will serve to increase the resistivity by lowering the net quantity of the predominating impurity as more and more of the diffusing impurity enters. When the net quantity is overcome, the semiconductor has its highest resistivity and is considered to be intrinsic. Further diffusion causes the diffused impurity to predominate changing the conductivity type of the semiconductor material. The impurity being diffused has an error function distribution through the crystal from a very high value at the surfaces which have been exposed to the source to decreased values inside the crystal. The resistivity, varying inversely with the distribution will be essentially zero at the surfaces and will rise with distance within the crystal. These items are illustrated by the resistivity curve of FIG. 6 wherein the resistivity of the "sandwich" of FIG. 5 varies from essentially zero at the surfaces A and B to a peak representing the intrinsic resistivity of the material at a particular temperature and then decreases to the original resistivity value of the semiconductor material sample. The conductivity type of the semiconductor material wafer is N type in this illustration from the surfaces to the vicinity of the intrinsic peak beyond which point sufficient N type impurity has not diffused to predominate; hence, the conductivity beyond this point remains as the original —P type. The vicinity of the intrinsic peak determines a P-N junction. A sandwich of the above described type may be prepared by exposing a 1 ohm centimeter P type wafer .015 inch thick to a vapor of arsenic having a concentration of $2\times10^{17}$ molecules per milliliter in a reducing atmosphere of 14.7 in. Hg at 800° centigrade for approximately 48 hours.

It will be apparent to one skilled in the art that from the above discussion and example "sandwiches" of any combination of conductivities and any variation of resistivities may be fabricated and that, since the sandwiches have a relatively large area in square inches, many relatively small, approximately 0.020 inch square dice may be cut therefrom for a large number of semiconductor devices.

Figure 7:
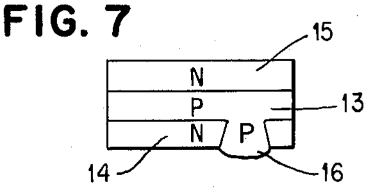

Considering next, FIG. 7, an ohmic contact is shown made to the P type center zone 13 of the N-P-N sandwich. This is accomplished by placing a quantity of material, including the desired impurity, capable of forming a low melting point alloy with the material of the semiconductor sample and heating. In the presence of heat, the alloy temperature of the semiconductor material-alloy material is reached and on subsequent cooling a region of semiconductor material recrystallizes out of the alloy in which is contained sufficient conductivity directing impurities to predominate. The alloy serves as an ohmic contact to this region. The depth of penetration of the alloy material into the semiconductor material is regulated by the quantity of alloy material applied and the temperature and duration of the temperature cycle.

In FIG. 7, a quantity of alloy material 16, such as indium, as shown applied to the surface of the N region 14 and the material has been subjected to a heat cycle sufficient to cause the indium to form an alloy and penetrate through the N region 14 into the P region 13. Since the region 13 is P type and the indium 16 is also a P type impurity the recrystallized region will be of the same conductivity type as the region 13 and will serve as an ohmic contact thereto. In a particular example, a 0.010 inch diameter indium sphere penetrated through the N region 14 into and formed an ohmic contact 16 with the P region 13 when heated at 700° centigrade for 30 minutes.

It will be apparent that what has thus been described is a simple and highly efficient way of making an ohmic contact to a thin internal region of a transistor, such as the base region of a junction transistor. In the event that the alloy temperature of the semiconductor material-conductivity directing impurity is greater than the melting temperature of the semiconductor material, the conductivity directing impurity may be alloyed with an intermediate material having the desired alloying temperature with the semiconductor material so long as the intermediate material is not itself an active impurity. An example of this type of situation exists with the combination of germanium as a semiconductor material and arsenic as an N type impurity. In order to get an alloying temperature lower than the melting temperature of germanium, it is necessary to use an intermediate alloy material such as lead.

Considering further, the significance of the above described operations, with this technique it is now possible to provide ohmic and rectifying contacts to semiconductor device bodies so that not only are good ohmic and rectifying contacts to thin and inaccessible regions possible, but since these contacts are capable of being made at any precise point in regions having a varying resistivity, the resistivity of the material immediately adjacent to the contact is now subject to control. Since it has been established in the art that the injection efficiency, symbolized $\gamma$, of a rectifying contact used as an emitter; that the reverse breakdown voltage of a rectifying contact; to a degree, the amount of minority carrier recombination affecting recovery time of a rectifying contact, and the quality of an ohmic contact, are all governed by the resistivity of the semiconductor material at the contact; it will be apparent that a technique giving this control is of considerable value in the fabrication of all types of semiconductor devices.

Figure 8:
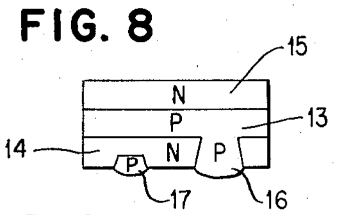

In FIG. 8, a second alloying operation is illustrated showing the formation of a rectifying contact having a precise resistivity control suitable for the variable threshold emitter described above. In this illustration, a quantity of material 17 including the desired impurity is alloyed under controlled conditions so that the depth of alloying is not completely through the N region 14 and a rectifying contact is provided. In a particular example, a pellet of indium, 0.005 inch in diameter, penetrated approximately 0.002 inch into the N region 14 forming the P region 17 when heated at 700° centigrade for five minutes.

Figure 9:
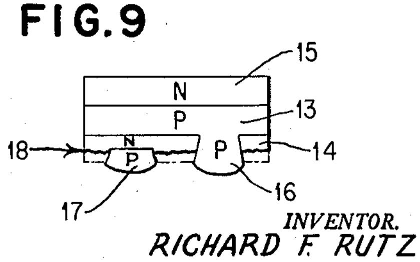

The intermediate product of FIG. 8 comprising a "sandwich" having ohmic and rectifying contacts made to the respective regions may be converted into a semiconductor device by separating the contacts and attaching electrical connections thereto. A method of separating the contacts is shown in FIG. 9 wherein a removal step is employed to take away unused portions of region 14. A preferred method of accomplishing this removal is by etching away either by chemical or electrolytic means the desired material. Other means, such as, sandblasting and conversion of the unwanted material to high resistivity may be used to accomplishd the same purpose as etching. Referring now to FIG. 9, the removal step is shown as partially completed with the unwanted portions of region 14 being removed to line 18 which represents the state of progress.

In a particular example, considering germanium semiconductor material at room temperature, an electrolytic etching operation carried out in an aqueous solution of potassium hydroxide (5% KOH) using 40 milliamperes of current will etch through a region approximately 0.005 inch thick in approximately two minutes. The reverse breakdown charcteristic between each electrode and the base electrode will give a measure of completion of the isolation. The rate of reaction between the etching operations selected and the material of contacts such as 16 and 17 should be less than the rate of reaction between the etching operation and the semiconductor material. It will be apparent that under conditions such as those shown under contact 17, there will be some undercutting of the part of the N region 14 under the contact 17 due to the action of the etching reagent on the sides of the region. This has not been found to be appreciable and is best controlled by making the diameter of the contact of a type, such as 17, so large that the undercutting in the time needed to etch away the unwanted portions of the region, such as 14, will be insignificant.

It will be apparent that what has been described this far in the process is a controlled fabrication technique whereby electrodes of varying types may be provided on a semiconductor crystal and each type of electrode may be caused to exhibit such advantageous characteristics as may be acquired by control of resistivity. For example, the technique of formation of ohmic connection 16 is of advantage in providing a low forward resistance contact useful in diode manufacture. In the case of contact 17, if used as a variable threshold emitter, control of injection efficiency ($\gamma$) and the point at which the reverse breakdown voltage is reached, is acquired by a choice of the depth of penetration of the alloyed region along the curve of FIG. 6. A further illustration would be the use of contact 17 as a collector; here, the problem of high reverse breakdown voltage sufficient for adequate collector potentials would be the prime consideration, hence, the depth of alloying would be to a different point on the curve of FIG. 6.

Figure 10:
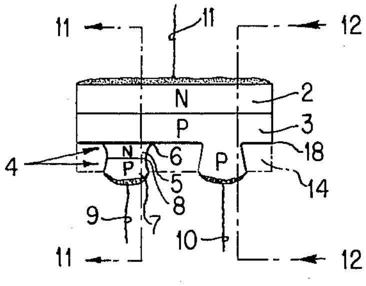

Electrical connections may now be applied to contacts 16 and 17 and to region 15 of the product shown in FIG. 9 and a transistor of the type described in connection with FIG. 1 will result. Referring now to FIG. 10, the transistor of FIG. 1 is shown wherein the same reference numerals are employed as those used in FIG. 1. In the illustration of FIG. 10, the variable threshold emitter 4 comprises a region 7 to which an ohmic contact and external connection 9 is made. Region 7 forms a PN junction 8 with a floating N region 5 which is all that remains of the original N region 14, N region 5 forms a PN junction 6 with the P region which serves as the base 3 of the transistor and to which ohmic connection 10 is attached. An ohmic contact 11 is made to N region 2 which serves as a collector and which forms a PN junction with the base region 3. Jagged line 18 shows the result of the removal operation and the extent of the original N region 14 is shown dotted.

Figure 11:
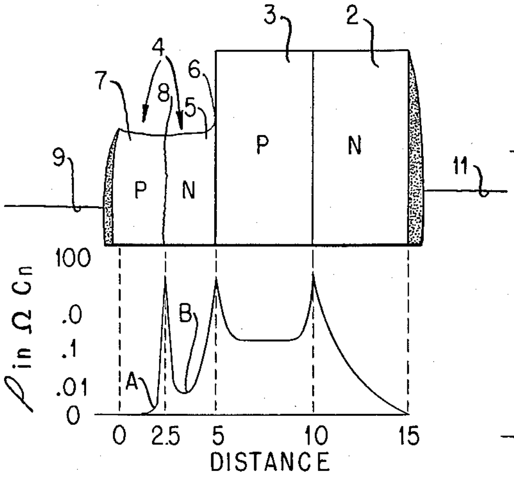
FIG. 11 is a cutaway view and graph of the transistor of FIG. 9 through the emitter showing the variation of resistivity therein.

A more detailed view of the contact 17 of FIG. 9 may be seen in connection with FIG. 11 wherein a graph of the variation in resistivity through the device along the line labeled 11—11 in FIG. 10. In FIG. 11 the resistivity graph is taken through the variable threshold emitter connection and shows a very low resistivity throughout the alloyed P region 7 with a sharp rise to intrinsic at the PN junction 8. In the floating region 5, the resistivity decreases rapidly to the point of penetration of the alloyed impurities at which point, the resistivity is as it was in the original sandwich described in connection with FIG. 6. The threshold voltage of this type of connection when used as an emitter is governed by the ratio of the resistivities at points A and B on the curve and the lower the resisitivity at B, with respect to A, the lower will be the reverse breakdown voltage or threshold voltage of the emitter. In contrast to this type of application, if it were desired to use this contact as a current amplifying type collector, giving the transistor an amplification factor greater than unity, it will be desirable, in order to withstand high collector voltages, to make the relationship of point B, with respect to A, greater, so that the reverse breakdown voltage will be higher. This type of collector is known in the art as a P–N hook type collector. Reverse breakdown voltages ranging from tenths of a volt to several hundred volts may be achieved by proper relationship of points A and B. Injection efficiency and all device parameters wherein resistivity values are involved may be similarly controlled.

Figure 12:
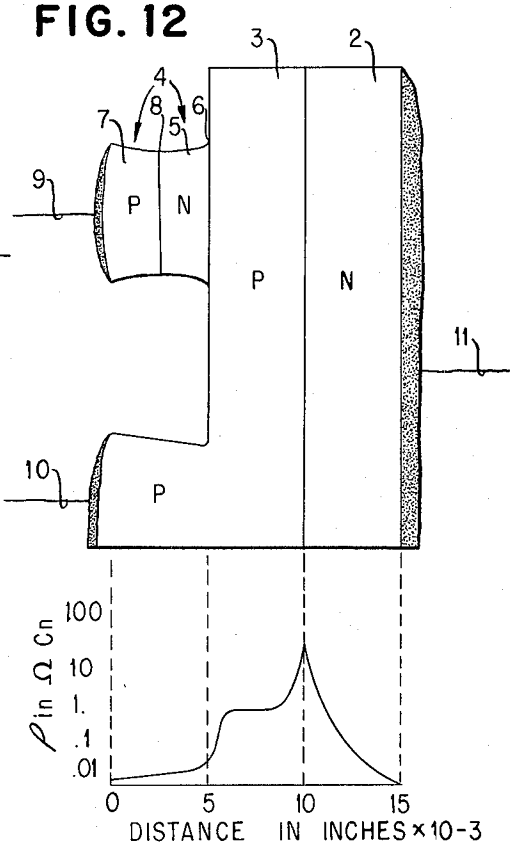
FIG. 12 is a cutaway view and graph of the transistor of FIG. 9 through the base connection showing the variation of resistivity therein.

Considering next FIG. 12, wherein a resistivity graph of the transistor of FIG. 10 is taken along the lines 12—12. In this graph, the resistivity is shown as very low through the ohmic P region to the base 3 where it rises to the 1 ohm centimeter value of the original sample. Thus, from the curve, it may be seen that such an ohmic contact has a very low resistance which would result in a superior low forward resistance diode when used in such an application and if used as a base contact for a transistor, as is illustrated, a minimum of minority carrier injection would be realized since the ratio of resistivitics on either side of the junction is very nearly unity. Structures of the type described above are disclosed and claimed in a divisional application of this application, Serial No. 763,542, filed September 26, 1958.

Figure 13:
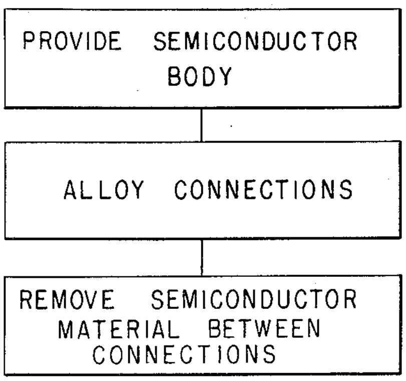
FIG. 13 is a flow chart of the steps involved in the manufacture of the transistor of FIGS. 1 and 9.

In FIG. 13, a chart is shown showing the steps used in forming a semiconductor device using the technique of this invention. The chart indicates the steps of providing a semiconductor body having a plurality of regions of different conductivity type, alloying connections to the body, separating the alloyed connections. As a result of the providing of a semiconductor body having a plurality of regions of different conductivity type ohmic, rectifying and current multiplying connections may be made to any desired region from a common surface through the overlaying regions by a controlled alloy technique and these connections may be isolated from each other by a removal step which acts to eliminate portions of the overlaying regions down to the innermost regions receiving a connection. Through the performance of this process on more than one surface of a semiconductor body, a wide variety of semiconductor device structures may be fabricated and through the providing of resistivity gradients in the regions of the semiconductor body precise control of the performance characteristics of the ultimate device may be realized. While in each of the above illustrations a region of essentially constant resistivity is shown for the base region of the transistor, it will be apparent to one skilled in the art that through the use of the region having the resistivity gradient as the base region or the floating region of a PN hook collector that a sweeping field may be provided in the ultimate device in accordance with the theory of the "graded base" or "drift" transistor known in the art.

Figure 14:
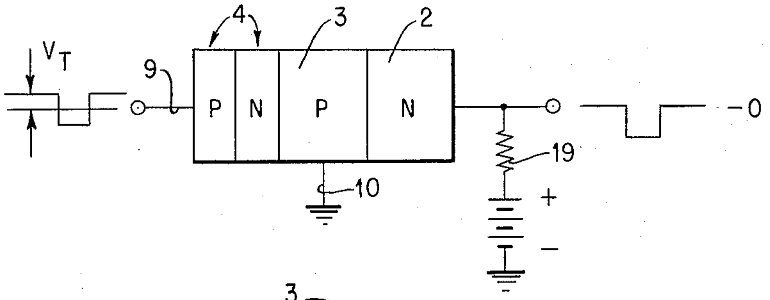
FIG.14 is a voltage translating circuit using the transistor of FIGS. 1 and 9.

Referring next to FIG. 14, a voltage translating amplifier circuit is shown as an illustration of one use of the variable threshold emitter transistor of FIG. 1. In this circuit, the transistor 1 of FIG. 1 is provided with an input applied between the lead 9 to the emitter 4 and reference potential. The transistor 1 has the base 3 connected to reference potential through lead 10 and the collector is connected through lead 11 and resistor 19 to the negative terminal of a power and bias source shown as battery 20. The input signal varies in this illustration from reference potential to a finite value greater than the threshold voltage capable of turning on the transistor. The signal developed at the output across resistor 19 is a translated replica of the input signal. The circuit, in addition to voltage translation and power amplification is also capable of presenting a high impedance to input level, shifts up to the magnitude of the threshold voltage $V_T$.

Figure 15:
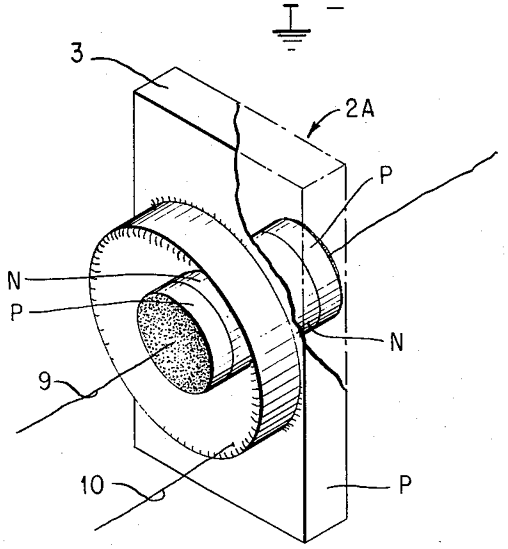
FIG. 15 is a schematic diagram of a junction transistor having an amplification factor greater than unity made by the method of this invention.

In FIG. 15, a perspective view of a transistor is shown wherein the transistor has an amplification factor greater than unity. The transistor is shown comprising a base 3 with an emitter 4 made by alloying partly through an overlaying region of a semiconductor body, as described above, having the base 3 as an interior region. A P-N hook type of collector 2A is provided by alloying in the same manner used to provide the emitter 4, to the opposite side of the base 3. An ohmic base contact 10 is shown circular in shape forming an ohmic connection with the base 3, as described above. The emitter, base and collector connections have been separated by a removal operation of portions of the overlaying semiconductor regions, as by etching, as described above.

Figure 16:
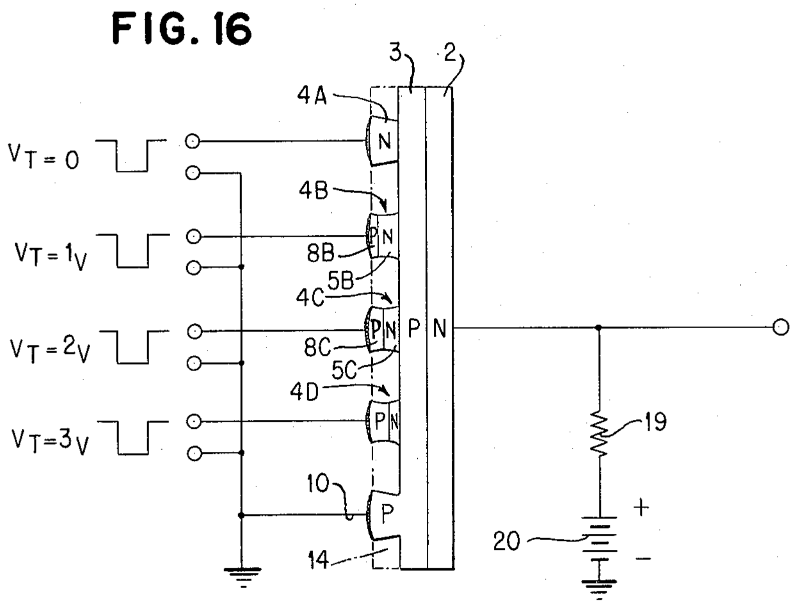
FIG. 16 is a circuit employing a multiple input transistor employed in this invention and capable of handling a plurality of input signals of different potential excursions.

In FIG. 16, an extension of the variable threshold emitter of the transistor of FIG. 1 is shown wherein a plurality of variable threshold emitters are shown to a single transistor. In FIG. 15, emitters 4A, 4B, 4C and 4D are shown in connection with a base 3 and collector 2, as described in the illustrations above. The collector 2 is shown connected through a load 19 to a power and bias source 20. The base 3 is provided with a base connection 10 formed, as described above. Emitters 4A through 4D are arranged to have progressively increasing threshold voltages. In the case of emitter 4A, an ohmic connection 9A is made to the original N region of a semiconductor body, as described above. This type of connection to N material, as illustrated, may be made by solder, plating, vapor deposition or any manner well known in the art for providing a non-rectifying connection. In the case of emitters 4B, 4C and 4D, the threshold voltage is progressively greater from 4B to 4D by the fact that the alloying of the P regions 7B, 7C and 7D is progressively deeper into the original N region 14, shown dotted. The progressively deeper alloying brings the PN junction 8 to progressively higher points on the resistivity curve, shown in FIG. 11, so that the ratio of points A and B in that figure is progressively greater and hence, as explained above, the threshold voltage is greater. This condition is illustrated in FIG. 15 by showing regions 5B through 5D of progressively decreasing thickness. The circuit of FIG. 15 may, in one application, serve as a mixer in which each input has a different threshold and in another example, it will provide a step output when all emitters are connected to a common signal which, in effect, is analog to digital conversion.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claims.

What is claimed is:

1. The method of making a semiconductor device comprising the steps of diffusing sufficient opposite conductivity type directing impurities into at least one surface of a semiconductor crystal of an original conductivity type to convert the conductivity type of a portion of said crystal to a predetermined depth, removing the ends of said crystal to thereby form a sandwich of alternate conductivity type zones, the middle zone comprising the original conductivity type portion, alloying at least one rectifying connection into said converted portion of said crystal in a restricted area to a depth corresponding to a specific resistivity value, selected in accordance with the performance characteristics desired from the semiconductive device, said selected depth not exceeding said predetermined depth, alloying at least one ohmic connection through said converted portion to said original conductivity type portion of said crystal to thereby establish said original conductivity type portion as the base region of the semiconductive device, and removing at least one portion of said crystal surrounding each said rectifying connection to expose said original conductivity type portion of said crystal.

2. The method of claim 1 wherein said removing step is accomplished by etching.

3. The method of making a semiconductor device comprising the steps of diffusing sufficient quantities of a single opposite conductivity type directing impurity into a surface of a semiconductor crystal of an original conductivity type to convert the conductivity type of a portion of said crystal to a predetermined depth, and establishing thereby a resistivity gradient in said converted portion, alloying to a selected depth, corresponding to a specific resistivity value in said gradient at least one rectifying connection to said converted portion of said crystal each said connection having a restricted area, alloying at least one ohmic connection through said converted portion to said original conductivity type portion of said crystal to thereby establish said original conductivity type portion as the base region of said semiconductive device and removing at least one portion of said crystal surrounding each said restricted area to a depth sufficient to expose said original conductivity type portion of said crystal.

4. The method of claim 3 wherein said removing step is accomplished by etching.

5. The method of making a semi-conductor device comprising, in combination, the steps of diffusing sufficient opposite conductivity type directing impurities into the surfaces of an original conductivity type semiconductor wafer to convert the conductivity type of at least one region of said wafer to a predetermined depth below said at least one surface establishing thereby a resistivity gradient in each said at least one converted region, alloying at least one restricted area ohmic contact through said converted semiconductor material into the original conductivity type portion of said wafer to thereby establish said original conductivity portion as the base region of said semiconductive device, alloying at least one restricted area rectifying contact into said converted semiconductor material to a depth selected in accordance with the performance desired from said semiconductive device and removing said converted semiconductor material not covered by said restricted areas to a depth sufficient to expose said original conductivity portion of said crystal.

6. The method of claim 5 wherein said removing step is accomplished by etching.

7. The method of making a semiconductor device comprising, in combination, the steps of diffusing sufficient opposite conductivity type directing impurities into the surfaces of an original conductivity type semiconductor wafer to convert the conductivity type of at least one region of said wafer to a predetermined depth below said at least one surface establishing thereby a resistivity gradient in each said at least one converted region, alloying at least one restricted area ohmic contact through said converted semiconductor material into the original conductivity type portion of said wafer, alloying a plurality of restricted area rectifying contacts into said converted semiconductor material each contact being alloyed to a depth corresponding to a selected value in said resistivity gradient in accordance with the performance characteristics desired from said semiconductive device, and removing said converted semiconductor material not covered by said restricted areas to a depth sufficient to expose said original conductivity portion of said crystal.

8. The method of claim 7 wherein said removing step is accomplished by etching.

References Cited in the file of this patent

UNITED STATES PATENTS

| | | |
|---|---|---|
| 2,654,059 | Shockley | Sept. 29, 1953 |
| 2,813,233 | Shockley | Nov. 12, 1957 |
| 2,817,609 | Waters | Dec. 24, 1957 |
| 2,821,493 | Carman | Jan. 28, 1958 |
| 2,861,018 | Fuller et al. | Nov. 18, 1958 |
| 2,879,190 | Logan et al. | Mar. 24, 1959 |